(12) United States Patent
Sohara

(10) Patent No.: US 12,436,475 B2
(45) Date of Patent: Oct. 7, 2025

(54) DETECTION APPARATUS, ALIGNMENT MICROSCOPE, AND EXPOSURE APPARATUS

(71) Applicant: Ushio Denki Kabushiki Kaisha, Tokyo (JP)

(72) Inventor: Naoya Sohara, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 165 days.

(21) Appl. No.: 18/393,599

(22) Filed: Dec. 21, 2023

(65) Prior Publication Data

US 2024/0241457 A1 Jul. 18, 2024

(30) Foreign Application Priority Data

Jan. 13, 2023 (JP) ................................ 2023-003560

(51) Int. Cl.
G03F 9/00 (2006.01)
G03F 7/00 (2006.01)
(52) U.S. Cl.
CPC ........ G03F 9/7088 (2013.01); G03F 7/70175 (2013.01); G03F 7/70191 (2013.01)
(58) Field of Classification Search
CPC ............. G03F 7/70175; G03F 7/70191; G03F 9/7088; G03F 9/7049; G03F 9/7073; G01B 11/26
See application file for complete search history.

(56) References Cited

U.S. PATENT DOCUMENTS

| 5,684,595 A * | 11/1997 | Kato ..................... G03F 9/7065 356/401 |
| 2011/0075123 A1 | 3/2011 | Nagamori |
| 2015/0158238 A1* | 6/2015 | Maeda .................. G03F 9/7088 425/150 |

FOREIGN PATENT DOCUMENTS

| JP | 2011-66185 A | 3/2011 |
| JP | 2021-117237 A | 8/2021 |

\* cited by examiner

*Primary Examiner* — Peter B Kim
(74) *Attorney, Agent, or Firm* — Studebaker Brackett PLLC

(57) ABSTRACT

A detection apparatus includes: an alignment microscope that captures an image of a mask mark and an image of a workpiece mark; and a position detector that detects a position of the mask mark and a position of the workpiece mark on the basis of those images. The alignment microscope includes an imaging unit, a beam splitter that splits each of the first light and the second light, and one or more aberration correction lenses. The beam splitter includes first and second members connected to each other with a light-splitting surface being sandwiched therebetween. All of first and second incident surfaces and emission surfaces are configured to have different surface directions with respect to the light-splitting surface. The one or more aberration correction lenses includes a first aberration correction lens disposed in a first optical path and a second aberration correction lens disposed in a second optical path.

17 Claims, 6 Drawing Sheets

DETECTION APPARATUS, ALIGNMENT MICROSCOPE, AND EXPOSURE APPARATUS

CROSS REFERENCE TO RELATED APPLICATIONS

This application claims the benefit of Japanese Priority Patent Application JP 2023-003560 filed Jan. 13, 2023, the entire contents of which are incorporated herein by reference.

BACKGROUND

The present invention relates to a detection apparatus, an alignment microscope, and an exposure apparatus that are applicable to detection of an alignment mark.

SUMMARY

In the step of manufacturing a pattern of a semiconductor element, a printed circuit board, a liquid crystal substrate, or the like by photolithography, an exposure apparatus is used. After performing alignment such that a mask on which a pattern is formed and a workpiece to which the pattern is to be transferred have a predetermined positional relationship, the exposure apparatus irradiates the workpiece with exposure light through the mask to transfer (expose) the mask pattern to the workpiece.

Japanese Patent Application Laid-open Nos. 2011-66185 and 2021-117237 each disclose an alignment microscope for performing alignment of a mask and a workpiece in an exposure apparatus as described above. By the alignment microscope, a mask mark formed on the mask and a workpiece mark formed on the workpiece are imaged. Positional coordinates of the mask mark and the workpiece mark are calculated on the basis of the captured images of the mask mark and the workpiece mark. At least one of the mask or the workpiece is moved such that the positions of both the mask and the workpiece have a positional relationship set in advance.

In recent years, the miniaturization of a wiring pattern or the like has become increasingly advanced, and a further improvement in exposure accuracy has been expected. Therefore, there is a need for a technology capable of improving accuracy in alignment of a mask and a workpiece.

In view of the circumstances as described above, it is desirable to provide a detection apparatus, an alignment microscope, and an exposure apparatus that are capable of performing alignment of a mask and a workpiece with high accuracy.

According to an embodiment of the present invention, there is provided a detection apparatus including an alignment microscope and a position detector.

The alignment microscope is disposed in an optical path of first light with which a mask mark as an alignment mark of an exposure mask is irradiated, and in an optical path of second light with which a workpiece mark as an alignment mark of a workpiece is irradiated, and captures an image of the mask mark and an image of the workpiece mark.

The position detector detects a position of the mask mark and a position of the workpiece mark on the basis of the image of the mask mark and the image of the workpiece mark, the images being captured by the alignment microscope.

Further, the alignment microscope includes an imaging unit, a beam splitter that splits each of the first light and the second light and emits the split first light and the split second light to the imaging unit, and one or more aberration correction lenses.

The beam splitter includes a light-splitting surface that splits each of the first light and the second light, and a first member and a second member that are connected to each other with the light-splitting surface being sandwiched therebetween.

All of a first incident surface on which the first light is incident, a first emission surface from which the first light is emitted, a second incident surface on which the second light is incident, and a second emission surface from which the second light is emitted are configured to have different surface directions with respect to the light-splitting surface.

Further, the one or more aberration correction lenses include one or more first aberration correction lenses that are disposed in a first optical path, the first optical path being the optical path of the first light to the imaging unit, and one or more second aberration correction lenses that are disposed in a second optical path, the second optical path being the optical path of the second light to the imaging unit.

In this detection apparatus, a configuration in which the light-splitting surface for splitting each of the first light and the second light is sandwiched between the first member and the second member is employed as the configuration of the beam splitter included in the alignment microscope. This makes it possible to stably exert the function of splitting light corresponding to each of the first light and the second light by the light-splitting surface. Further, the aberration correction lenses are disposed in the first optical path and the second optical path. This makes it possible to capture the image of the mask mark and the image of the workpiece mark with high accuracy and to detect the position of the mask mark and the position of the workpiece mark with high accuracy. As a result, it is possible to perform alignment of the exposure mask and the workpiece with high accuracy.

The beam splitter may be a cube beam splitter.

The beam splitter may be configured such that each of the first incident surface, the first emission surface, the second incident surface, and the second emission surface has a surface-direction intersection angle that is larger than 30 degrees with respect to the light-splitting surface.

The beam splitter may be configured such that each of the first incident surface, the first emission surface, the second incident surface, and the second emission surface has a surface-direction intersection angle that is 45 degrees with respect to the light-splitting surface.

The beam splitter may be configured such that the first incident surface has an intersection angle falling within a range from 75 degrees to 105 degrees with respect to the first optical path.

The beam splitter may be configured such that the first emission surface has an intersection angle falling within a range from 75 degrees to 105 degrees with respect to the first optical path.

The beam splitter may be configured such that the second incident surface has an intersection angle falling within a range from 75 degrees to 105 degrees with respect to the second optical path.

The beam splitter may be configured such that the second emission surface has an intersection angle falling within a range from 75 degrees to 105 degrees with respect to the second optical path.

The one or more first aberration correction lenses may be disposed in at least one of a position facing the first incident surface or a position facing the first emission surface. In this case, the one or more second aberration correction lenses may be disposed in at least one of a position facing the second incident surface or a position facing the second emission surface.

The one or more first aberration correction lenses may be disposed in at least one of a position facing a common incident surface on which both the first light and the second light are incident or a position facing a common emission surface from which both the first light and the second light are emitted. In this case, the one or more second aberration correction lenses may be disposed in at least one of the position facing the common incident surface or the position facing the common emission surface.

The first optical path and the second optical path may include a common optical path. In this case, the one or more aberration correction lenses may include one or more common correction lenses that are disposed in the common optical path and function as the first aberration correction lenses and as the second aberration correction lenses.

The one or more aberration correction lenses may be configured as the one or more common correction lenses.

The common optical path may include the optical path of the first light and the optical path of the second light, the first light and the second light being emitted from the beam splitter to the imaging unit. In this case, the one or more common correction lenses may be disposed in a position facing a common emission surface from which both the first light and the second light are emitted, the first light and the second light traveling in the common optical path from the beam splitter to the imaging unit.

The first member and the second member may be made of a material having an identical refractive index.

The first light may be exposure light. In this case, the second light may be non-exposure light.

According to another embodiment of the present invention, there is provided an alignment microscope including an imaging unit, the beam splitter described above, and the one or more aberration correction lenses described above.

According to still another embodiment of the present invention, there is provided an exposure apparatus including the detection apparatus descried above, a light-emission unit, a mask stage, and a workpiece stage.

The light-emission unit emits the exposure light.

The mask stage holds the exposure mask.

The workpiece stage holds the workpiece.

At least one of the mask stage or the workpiece stage is configured to be movable.

As described above, according to the present invention, it is possible to perform alignment of a mask and a workpiece with high accuracy. Note that the effects described herein are not necessarily limited and may be any effect described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment according to the present invention will be described with reference to the drawings.

[Configuration of Exposure Apparatus]

Figure 1:
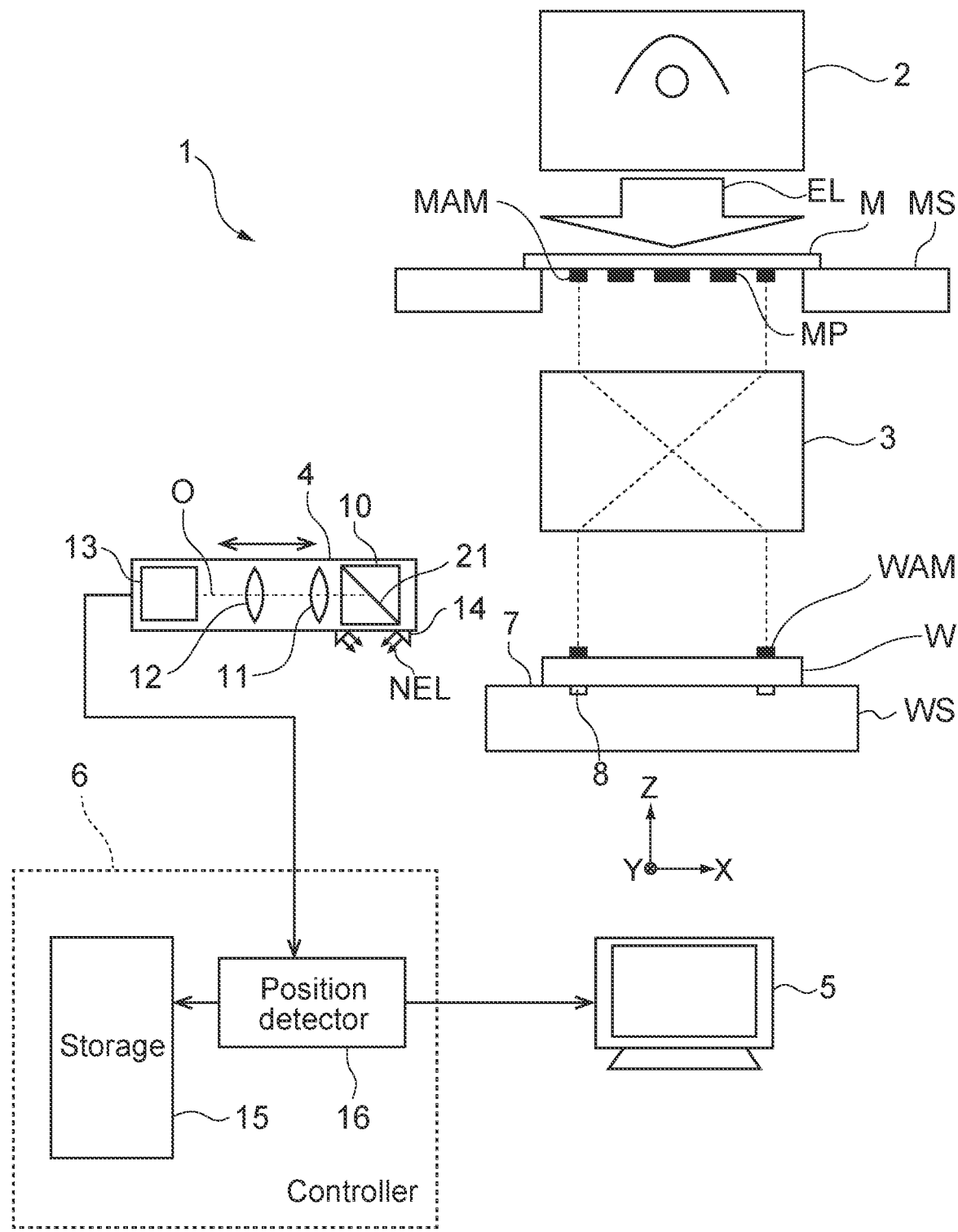
FIG. 1 is a schematic diagram showing a basic configuration example of an exposure apparatus according to one embodiment of the present invention.

FIG. 1 is a schematic diagram showing a basic configuration example of an exposure apparatus according to one embodiment of the present invention.

An exposure apparatus 1 includes a light-emission unit 2, a mask stage MS, a workpiece stage WS, a projection lens 3, an alignment microscope 4, a monitor 5, and a controller 6.

Hereinafter, as shown in FIG. 1, an optical axis direction of the light-emission unit 2 (emission direction of exposure light EL) will be referred to as a Z direction, the positive side of the Z axis as an upper side, and the negative side thereof as a lower side. Further, a direction orthogonal to the Z direction and extending in the right and left of the figure will be referred to as an X direction, the positive side of the X axis as a right side, and the negative side thereof as a left side. Further, a depth direction orthogonal to the Z direction and the X direction and extending perpendicularly to the plane of the figure will be referred to as a Y direction, the positive side of the Y axis as a far side, and the negative side thereof as a near side. As a matter of course, for the application of the present technology, a direction in which the exposure apparatus 1 (alignment microscope 4) is disposed and the like are not limited.

The light-emission unit 2 emits exposure light EL toward the lower side. For example, a short-arc mercury lamp is used as the light-emission unit 2. For example, ultraviolet light including the wavelengths of 365 nm (i-line), 405 nm (h-line), 436 nm (g-line), and the like is emitted from the mercury lamp. As a matter of course, the present invention is not limited to such a configuration. A lamp that emits light in a wavelength band different from that of the ultraviolet light may be used. In addition, a solid-state light source such as a light-emitting diode (LED) or a laser diode (LD) may be used.

The mask stage MS is disposed on the lower side of the light-emission unit 2. The mask stage MS holds an exposure mask (hereinafter, simply referred to as mask) M. In this embodiment, the mask M is disposed to be orthogonal to the optical axis direction of the light-emission unit 2 (Z direction). The mask M includes a predetermined mask pattern MP formed thereon. Further, the mask M includes an alignment mark (mask mark) MAM formed thereon. The mask mark MAM is also referred to as a mask/alignment mark.

The workpiece stage WS holds a workpiece W. In this embodiment, the workpiece W is disposed to be orthogonal to the optical axis direction of the light-emission unit 2 (Z direction). The workpiece stage WS is configured to be capable of linearly moving (performing linear motion) in each of the horizontal direction (X direction) and the depth direction (Y direction). Further, the workpiece stage WS is configured to be capable of rotating with the vertical direction (Z direction) being used as a rotation-axis direction.

When the workpiece stage WS is driven, a relative position of the workpiece W to the mask M can be varied. Note that the mask stage MS may be configured to be capable of linearly moving in each of the horizontal direction (X direction) and the depth direction (Y direction) and rotating with the vertical direction (Z direction) being used as a rotation-axis direction. Alternatively, both the mask stage MS and the workpiece stage WS may be configured to be movable (rotatable).

The workpiece W includes an alignment mark (workpiece mark) WAM formed thereon. The workpiece mark WAM is also referred to as a workpiece/alignment mark.

In rotation directions in which the horizontal direction (X direction), the depth direction (Y direction), and the vertical direction (Z direction) are rotation-axis directions, it is desirable to form three or more mask marks MAM for the mask M in order to align the mask M and the workpiece W. The same number of workpiece marks WAM is formed on the workpiece W so as to correspond to the three or more mask marks MAM.

For example, it is assumed that a mask M having a rectangular shape as viewed from the vertical direction (Z direction) is used. In this case, for example, the mask marks MAM are formed at four corners of the mask M. Further, a substrate having a rectangular shape as viewed from the vertical direction (Z direction) is disposed as the workpiece W. The workpiece marks WAM are formed at four corners of the workpiece W so as to correspond to the mask marks MAM formed at the four corners of the mask M. As a matter of course, the present invention is not limited to such a configuration.

The mask mark MAM and the workpiece mark WAM corresponding to each other are formed to have a predetermined positional relationship if the mask M and the workpiece W have a desired positional relationship as viewed from the vertical direction (Z direction). In this embodiment, description will be given assuming that the mask mark MAM and the workpiece mark WAM corresponding to each other are located at the same position if the mask M and the workpiece W have a desired positional relationship. As a matter of course, the present invention is not limited to such a setting, and any positional relationship may be set as a predetermined positional relationship.

As shown in FIG. 1, a reflective mirror 8 is embedded in a placement surface 7 of the workpiece stage WS, on which the workpiece W is to be placed. When irradiation with the exposure light EL is performed in a state in which the mask M is disposed but the workpiece W is not disposed, the reflective mirror 8 is disposed at a position at which an image of the mask mark MAM appears, that is, at a position on which image light of the mask mark MAM is incident. Therefore, in this embodiment, the position at which the reflective mirror 8 is disposed is substantially equal to the position of the workpiece mark WAM when the workpiece W is disposed on the workpiece stage WS.

When alignment of the mask M and the workpiece W is completed, an exposure step is started, and the exposure light EL is emitted from the light-emission unit 2. The workpiece W coated with a resist is irradiated with the exposure light EL, which is emitted from the light-emission unit 2, through the mask M on which the mask pattern MP is formed and the projection lens 3. Thus, the mask pattern MP is projected onto the workpiece W and exposed.

The alignment microscope 4 is used for alignment of the mask M and the workpiece W. The alignment microscope 4 can capture an enlarged image of the mask mark MAM and an enlarged image of the workpiece mark WAM.

The alignment microscope 4 has a roughly columnar shape extending in one direction and incorporates a beam splitter 10, one or more aberration correction lenses 11, an objective lens 12, and an imaging unit 13.

The alignment microscope 4 is disposed such that the extending direction of the columnar shape is the horizontal direction (X direction) and is configured to be movable. Specifically, the alignment microscope 4 is configured to be movable from an imaging position, at which the beam splitter 10 is disposed between the projection lens 3 and the workpiece stage WS (workpiece W) (see FIGS. 2 and 3), to a retracted position shown in FIG. 1.

The alignment microscope 4 is favorably configured to be freely movable in each of the horizontal direction (X direction), the depth direction (Y direction), and the vertical direction (Z direction). Meanwhile, the present invention is not limited to such a configuration. A direction in which the alignment microscope 4 is movable may be limited as long as the alignment microscope 4 is movable between the imaging position and the retracted position. For example, the alignment microscope 4 may be configured to be movable only in the horizontal direction (X direction).

Inside the alignment microscope 4, the beam splitter 10, the one or more aberration correction lenses 11, the objective lens 12, and the imaging unit 13 are disposed with an imaging optical axis O of the imaging unit 13 being used as a reference. As the imaging unit 13, for example, a digital camera including an image sensor such as a charge-coupled device (CCD) sensor or a complementary metal-oxide semiconductor (CMOS) sensor is used. In addition, a digital camera using an image-forming lens such as a non-telecentric lens or a telecentric lens and the image sensor in combination may be used.

Further, an illumination unit 14 is disposed at a position on the lower side of the beam splitter 10 of the alignment microscope 4. The illumination unit 14 emits non-exposure light NEL toward the lower side. For example, a ring lighting is used as the illumination unit 14, and visible light is emitted as the non-exposure light NEL. As a matter of course, the present invention is not limited to such a configuration, and a configuration in which a coaxial illumination method is performed may be employed.

Note that the configuration of the alignment microscope 4 will be described later in detail using exemplar variations.

The controller 6 controls an operation of each block of the exposure apparatus 1. The controller 6 includes hardware necessary for the computer, for example, a processor such as a central processing unit (CPU), a graphics processing unit (GPU), or a digital signal processor (DSP), a memory such as a read-only memory (ROM) or a random access memory (RAM), and a storage device such as a hard disk drive (HDD). In this embodiment, storage 15 is formed by a storage device such as a nonvolatile memory. In order to implement the storage 15, any non-transitory computer-readable storage medium may be used.

The processor of the controller 6 loads a program according to the present technology, which is stored in the storage 15 or the memory, to the RAM and executes the program, so that an exposure method including an alignment method according to the present technology is executed.

As the controller 6, for example, a programmable logic device (PLD) such as a field-programmable gate array (FPGA), another device such as an application specific integrated circuit (ASIC), or the like may be used.

In this embodiment, the processor of the controller 6 executes the program according to the present technology, and thus a position detector 16 is implemented as a functional block. The position detector 16 detects a position of the mask mark MAM and a position of the workpiece mark WAM on the basis of the image of the mask mark MAM and the image of the workpiece mark WAM, which are captured by the imaging unit 13 of the alignment microscope 4.

Further, on the basis of the detected position of the mask mark MAM and the detected position of the workpiece mark WAM, the position detector 16 controls the workpiece stage WS to perform alignment such that the mask M and the workpiece W have a desired positional relationship. Specifically, the position detector 16 controls the workpiece stage WS such that the mask mark MAM and the workpiece mark WAM are located at the same position, that is, have a predetermined positional relationship. This makes it possible to align the mask M and the workpiece W.

As a matter of course, the functional blocks that execute various types of control regarding exposure are established in the controller 6, though not illustrated. Further, in order to implement the functional blocks including the position detector 16, dedicated hardware such as an integrated circuit (IC) may be appropriately used.

Figure 2:
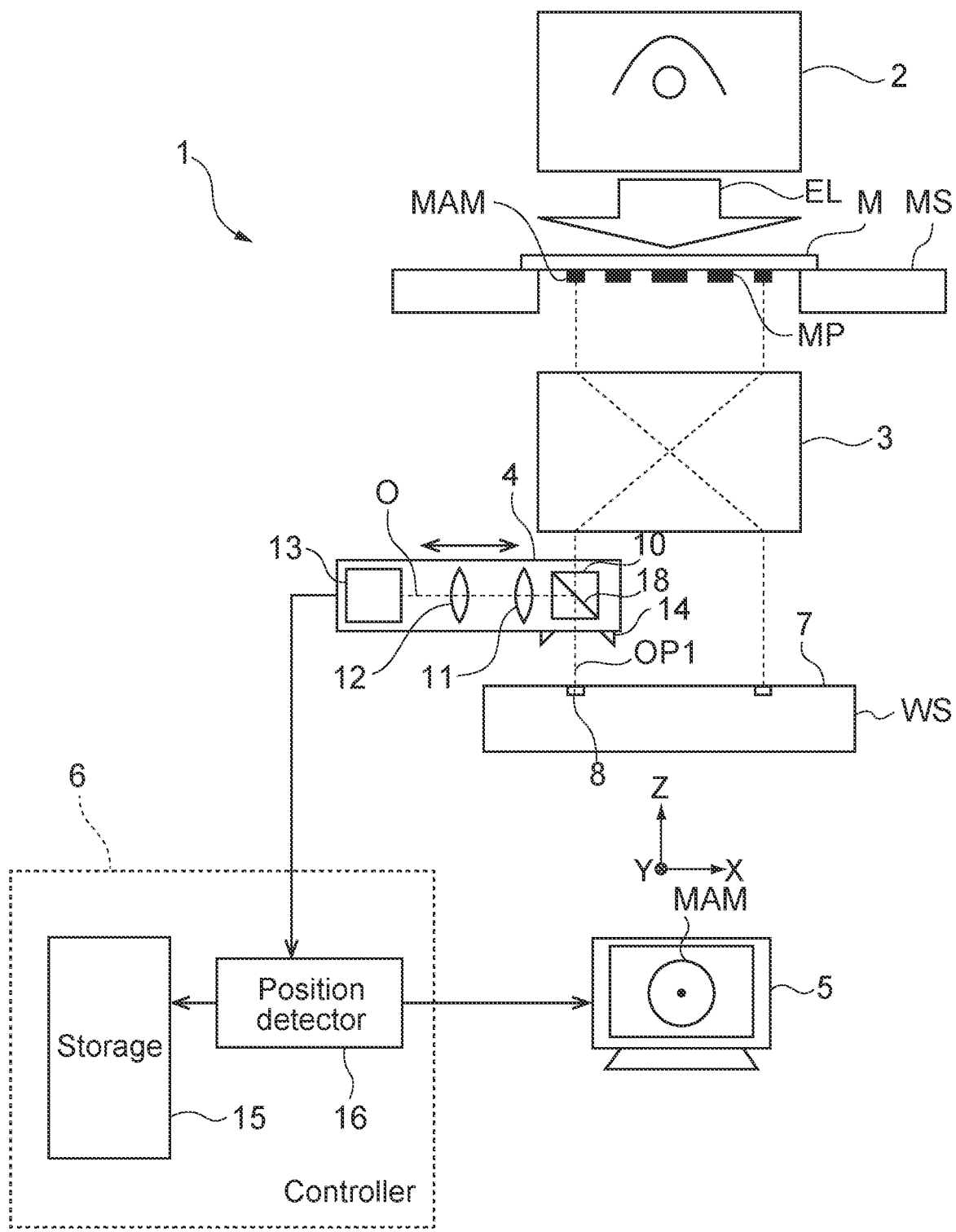
FIG. 2 is a schematic diagram for describing an operation example of detecting an alignment mark using an alignment microscope (detection of mask mark)
Figure 3:
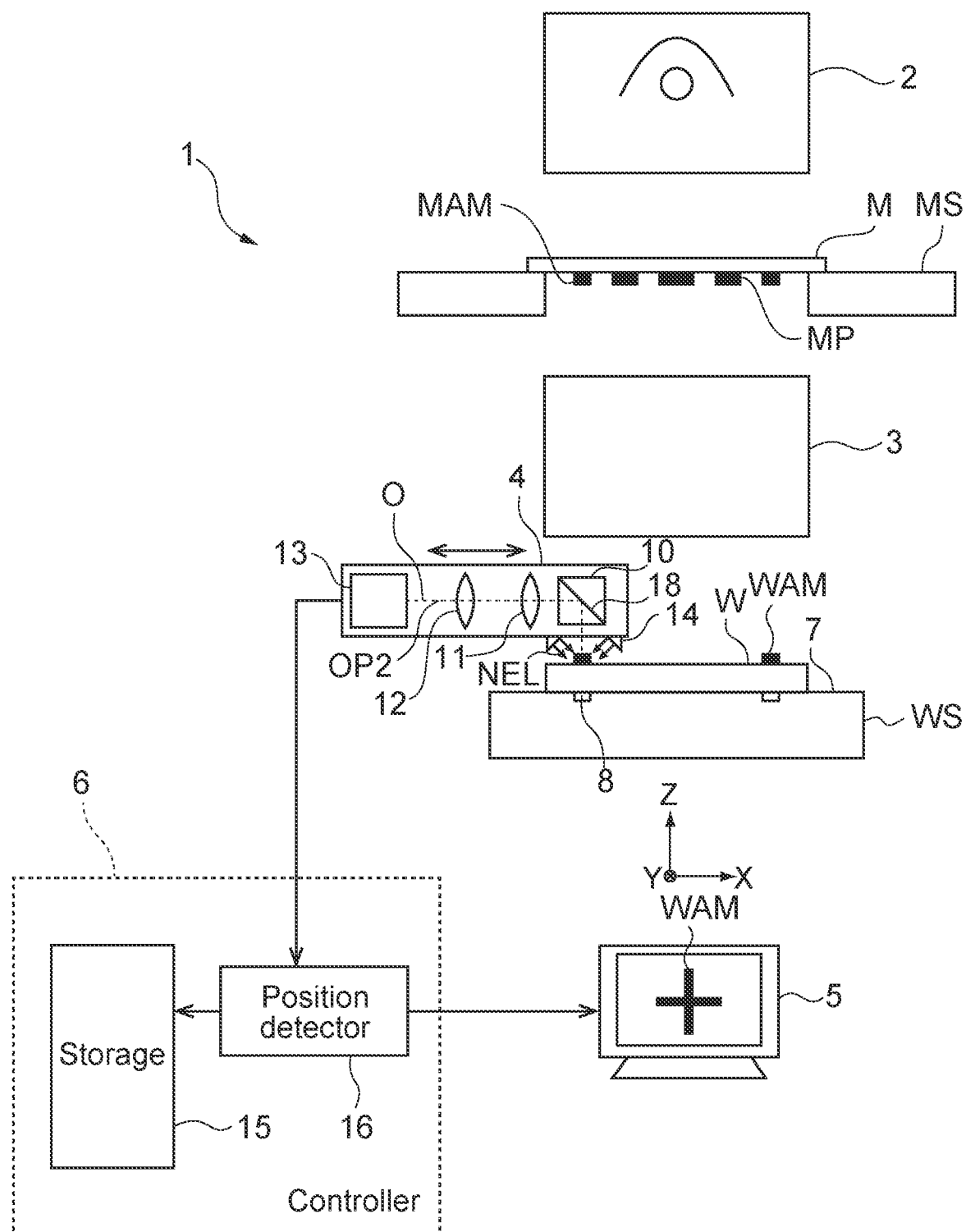
FIG. 3 is a schematic diagram for describing an operation example of detecting an alignment mark using the alignment microscope (detection of workpiece mark)

FIGS. 2 and 3 are schematic diagrams for describing an operation example of detecting an alignment mark using the alignment microscope 4. First, as shown in FIG. 2, the mask M is disposed on the mask stage MS. For example, the controller 6 drives a robot arm or the like (illustration omitted) such that the mask M is disposed at a reference position before alignment. As a matter of course, the mask M may be disposed by an operator.

Note that the workpiece W is not disposed on the workpiece stage WS. Thus, the reflective mirror 8 provided in the placement surface 7 of the workpiece stage WS is exposed toward the upper side.

As shown in FIG. 2, the alignment microscope 4 is moved to the imaging position of the alignment mark. In this embodiment, the imaging position of the alignment mark is set between the projection lens 3 and the workpiece stage WS (workpiece W). The imaging position of the alignment mark is set to be a position in the optical path of the exposure light EL with which the mask mark MAM is irradiated, and a position in the optical path of the non-exposure light NEL with which the workpiece mark WAM is irradiated.

As shown in FIG. 2, in this embodiment, the exposure light EL with which the mask mark MAM is irradiated travels toward the reflective mirror 8 provided in the workpiece stage WS through the projection lens 3, and then travels to the upper side after being reflected by the reflective mirror 8.

The alignment microscope 4 is disposed such that a light-splitting surface 18 of the beam splitter 10 is located in the optical path of the exposure light EL with which the mask mark MAM is irradiated. In other words, the alignment microscope 4 is disposed at a position where the exposure light EL with which the mask mark MAM is irradiated enters the light-splitting surface 18 of the beam splitter 10. Note that the optical path of the exposure light EL with which the mask mark MAM is irradiated can also be referred to as an optical path of image light of the mask mark MAM.

As shown in FIG. 2, in this embodiment, the light-splitting surface 18 of the beam splitter 10 is disposed at an intersection angle of 45 degrees with respect to the optical path of the exposure light EL, the optical path extending in the vertical direction (Z direction). Specifically, the beam splitter 10 is disposed such that the light-splitting surface 18 is parallel to the direction of a slant angle of 45 degrees from the upper left to the lower right.

When the exposure light EL is emitted from the light-emission unit 2, the exposure light EL with which the mask mark MAM is irradiated enters the beam splitter 10 from the upper side through the projection lens 3. The exposure light EL passing through the light-splitting surface 18 of the beam splitter 10 and traveling toward the lower side is reflected toward the upper side by the reflective mirror 8.

The exposure light EL reflected toward the upper side enters the beam splitter 10 again. The exposure light EL reflected by the light-splitting surface 18 of the beam splitter 10 travels toward the left side along the horizontal direction (X direction). The exposure light EL enters the imaging unit 13 through the one or more aberration correction lenses 11 and the objective lens 12. Thus, an image of the mask mark MAM is captured by the imaging unit 13.

Hereinafter, the optical path, of the exposure light EL with which the mask mark MAM is irradiated, to the imaging unit 13 will be referred to as a first optical path OP1.

The position detector 16 of the controller 6 detects a position of the mask mark MAM on the basis of the image of the mask mark MAM captured by the imaging unit 13 of the alignment microscope 4. Further, in this embodiment, the position detector 16 can also take in the image of the mask mark MAM captured by the imaging unit 13, and cause the monitor 5 to display the image. The operator can confirm the detection of the mask mark MAM by visually recognizing the image of the mask mark MAM displayed on the monitor 5.

In this embodiment, the position detector 16 detects coordinates of the central position of the mask mark MAM as a position of the mask mark MAM. In the example shown in FIG. 2, a circular mask mark MAM is detected, and the coordinates of the central position thereof are calculated. As a matter of course, the shape of the mask mark MAM, and a position of the mask mark MAN to be calculated as a position of the mask mark MAN are not limited and may be discretionally set.

In order to detect the position of the mask mark MAM, for example, any image recognition technology such as image size conversion, character recognition, shape recognition, matching processing using a model image of an object, edge detection, or projection transformation may be used. Further, any machine learning algorithm using, for example, a deep neural network (DNN), a recurrent neural network (RNN), or a convolutional neural network (CNN) may be used.

The image of the mask mark MAN acquired by the position detector 16, and the position of the mask mark MAM detected by the position detector 16 (coordinates of central position) are stored in the storage 15.

As shown in FIG. 3, the emission of the exposure light EL by the light-emission unit 2 is stopped. The workpiece W is then disposed on the workpiece stage WS. For example, the controller 6 drives a robot arm or the like (illustration omitted) such that the workpiece W is disposed at a reference position before alignment. As a matter of course, the workpiece W may be disposed by the operator.

The alignment microscope 4 is not moved and remains disposed at the imaging position of the alignment mark. The illumination unit 14 of the alignment microscope 4 then irradiates the workpiece mark WAM with the non-exposure light NEL. The non-exposure light NEL with which the workpiece mark WAM is irradiated is reflected by the workpiece mark WAM and enters the beam splitter 10 disposed on the upper side of the workpiece mark WAM.

The non-exposure light NEL that is incident on the beam splitter 10 is reflected by the light-splitting surface 18 and travels toward the left side along the horizontal direction (X direction). The non-exposure light NEL enters the imaging unit 13 through the one or more aberration correction lenses 11 and the objective lens 12. Thus, the image of the workpiece mark WAM is captured by the imaging unit 13.

Hereinafter, the optical path, of the non-exposure light NEL with which the workpiece mark WAM is irradiated, to the imaging unit 13 will be referred to as a second optical path OP2.

In this embodiment, the second optical path OP2 of the non-exposure light NEL is equal to the optical path from the reflective mirror 8 to the imaging unit 13 in the first optical path OP1 of the exposure light EL. In other words, the second optical path OP2 of the non-exposure light NEL and the optical path of the exposure light EL from the reflective mirror 8 to the imaging unit 13 become a common optical path. Therefore, the alignment microscope 4 disposed at the imaging position of the alignment mark is disposed in the optical path of the non-exposure light NEL with which the workpiece mark WAM is irradiated.

The position detector 16 of the controller 6 detects a position of the workpiece mark WAM on the basis of the image of the workpiece mark WAM captured by the imaging unit 13 of the alignment microscope 4. Further, the position detector 16 can also take in the image of the workpiece mark WAM captured by the imaging unit 13, and cause the monitor 5 to display the image. Thus, the operator can confirm the detection of the workpiece mark WAM by visually recognizing the image of the workpiece mark WAM displayed on the monitor 5.

As shown in FIG. 3, in this embodiment, coordinates of the central position of the workpiece mark WAM having a cross shape are calculated as a position of the workpiece mark WAM. As a matter of course, the shape of the workpiece mark WAM, and a position of the workpiece mark WAM to be calculated as a position of the workpiece mark WAM are not limited and may be discretionally set. For example, the workpiece mark WAN may be configured with the same shape as that of the mask mark MAM.

The image of the workpiece mark WAM acquired by the position detector 16, and the position of the workpiece mark WAM detected by the position detector 16 (coordinates of central position) are stored in the storage 15.

The position detector 16 controls the workpiece stage WS such that the positional relationship between the mask mark MAM and the workpiece mark WAM is a predetermined positional relationship. In this embodiment, the workpiece stage WS is driven such that the position of the mask mark MAM (coordinates of central position) and the position of the workpiece mark WAM (coordinates of central position) coincide with each other, and a relative position of the workpiece W to the mask M is controlled.

FIGS. 1 to 3 show only the single alignment microscope 4 disposed for a set of the mask mark MAM and the workpiece mark WAM corresponding to each other. If a plurality of sets of the mask mark MAM and the workpiece mark WAM are formed, alignment is performed using the alignment microscopes 4 for the plurality of sets of the mask mark MAM and the workpiece mark WAM corresponding to each other.

For example, a single alignment microscope 4 is disposed for each set of the mask mark MAM and the workpiece mark WAM corresponding to each other, and an image of the mask mark MAM and an image of the workpiece mark WAM are captured. The present invention is not limited to the above, and an image of the mask mark MAM and an image of the workpiece mark WAM may be sequentially captured by a smaller number of alignment microscopes 4, e.g., one alignment microscope 4, than the number of sets of the mask mark MAM and the workpiece mark WAM.

For example, the mask marks MAM are formed at four corners of the rectangular mask M, and the workpiece marks WAM are formed at four corners of the workpiece W formed of a rectangular substrate. In this case, four alignment microscopes 4 are respectively disposed at imaging positions of the alignment marks, the imaging positions being a position in the optical path of the exposure light EL with which the mask mark MAM is irradiated and a position in the optical path of the non-exposure light NEL with which the workpiece mark WAM corresponding to the mask mark MAM is irradiated.

The position detector 16 of the controller 6 detects the positions of the four mask marks MAM and the positions of the four workpiece marks WAM. The workpiece stage WS is then controlled such that the four sets of the mask mark MAN and the workpiece mark WAM corresponding to each other respectively have predetermined positional relationships. This makes it possible to perform alignment of the mask M and the workpiece W in the rotation directions with the horizontal direction (X direction), the depth direction (Y direction), and the vertical direction (Z direction) being used as rotation-axis directions.

When the alignment of the mask M and the workpiece W is completed, the alignment microscope 4 is retracted to the retracted position shown in FIG. 1. As a matter of course, the alignment microscope 4 may be retracted to the retracted position at other timings such as a timing at which capturing of the image of the mask mark MAM and the image of the workpiece mark WAM are completed, and a timing at which the detection of the position of the mask mark MAM and the position of the workpiece mark WAM by the position detector 16 is completed.

In the example shown in FIG. 3, the illumination unit 14 disposed in the alignment microscope 4 irradiates the workpiece mark WAM with the non-exposure light NEL. The present invention is not limited to the above. An illumination unit that is disposed at another position in the exposure apparatus 1 may irradiate the workpiece mark WAM with the non-exposure light NEL.

For example, the illumination unit may be disposed on the upper side of the beam splitter 10 and irradiate the beam splitter 10 with the non-exposure light NEL from the upper side toward the lower side. In this case, the workpiece mark WAM is irradiated with the non-exposure light NEL from the illumination unit toward the lower side, and the non-exposure light NEL is reflected toward the upper side by the workpiece mark WAM. In this case as well, the alignment microscope 4 disposed at the imaging position of the alignment mark shown in FIGS. 2 and 3 can capture the image of the workpiece mark WAM.

Alternatively, the light-emission unit 2 may emit the exposure light EL and the non-exposure light NEL to be switchable. The exposure light EL may be emitted during detection of the mask mark MAM, and the non-exposure light NEL may be emitted during detection of the workpiece mark WAM.

For example, a light source that can emit light in a wide wavelength band including both the wavelength band of the exposure light EL and the wavelength band of the non-exposure light NEL is disposed as the light-emission unit 2. On the emission side of the light source, a first optical filter that transmits only the exposure light EL and a second optical filter that transmits only the non-exposure light NEL are disposed to be exchangeable. The first optical filter is disposed on the emission side of the light source during detection of the mask mark MAM, and the second optical filter is disposed on the emission side of the light source during detection of the workpiece mark WAM. Such a configuration can also be employed.

In this case, the whole optical path of the exposure light EL that is emitted from the light-emission unit 2 and used to irradiate the mask mark MAM in the middle and then enters the imaging unit 13, and the whole optical path of the non-exposure light NEL that is emitted from the light-emission unit 2 and used to irradiate the workpiece mark WAM in the middle and then enters the imaging unit 13 are equal to each other.

Meanwhile, the first optical path OP1 of the exposure light EL with which the mask mark MAM has been irradiated, and the second optical path OP2 of the non-exposure light NEL with which the workpiece mark WAM has been irradiated are similar to the examples shown in FIGS. 2 and 3.

In this embodiment, the mask mark MAM corresponds to one embodiment of a mask mark according to the present invention, which is an alignment mark of an exposure mask. The workpiece mark WAM corresponds to one embodiment of a workpiece mark according to the present invention, which is an alignment mark of a workpiece.

Further, the exposure light EL with which the mask mark MAM is irradiated corresponds to one embodiment of first light according to the present invention. The non-exposure light NEL with which the workpiece mark WAM is irradiated corresponds to one embodiment of second light according to the present invention.

Further, the beam splitter 10 corresponds to one embodiment of a beam splitter according to the present invention, which splits each of the first light and the second light and emits the split light to the imaging unit. The light-splitting surface 18 of the beam splitter 10 corresponds to one embodiment of a light-splitting surface according to the present invention, which splits each of the first light and the second light.

Further, the first optical path OP1 corresponds to one embodiment of an optical path of the first light to the imaging unit. The second optical path OP2 corresponds to one embodiment of an optical path of the second light to the imaging unit.

[Improvement in Imaging Accuracy of Alignment Mark]

The inventors of the present invention have repeatedly studied the imaging accuracy of the image of the mask mark MAM and the image of the workpiece mark WAM, which are captured by the alignment microscope 4. Specifically, in order to improve the accuracy of both images to be captured, the inventors of the present invention have repeatedly studied the configuration of the beam splitter 10 mounted on the alignment microscope 4, and correction of aberrations of the images of the mask mark MAM and the workpiece mark WAM, which are formed on the imaging unit 13 (image sensor).

[Sandwich Structure]

Figure 4:
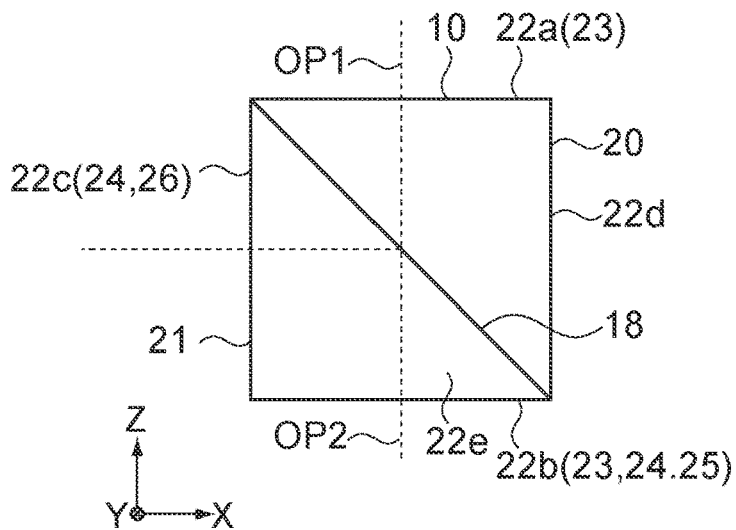
FIG. 4 is a schematic diagram showing a configuration example of a beam splitter.
Figure 5:
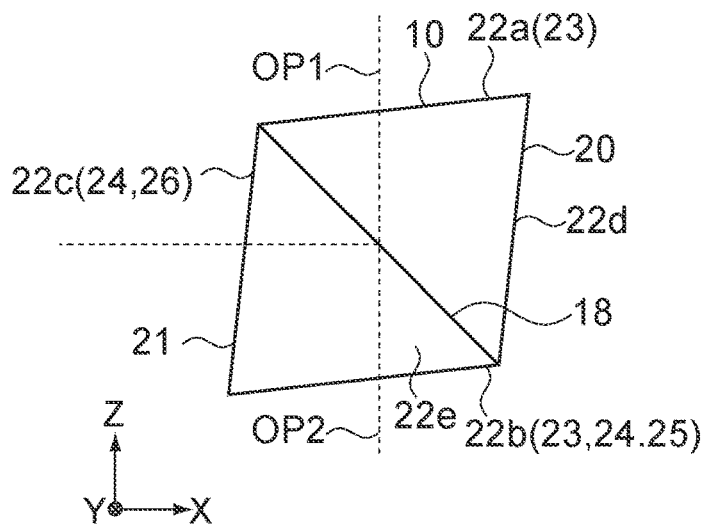
FIG. 5 is a schematic diagram showing a configuration example of the beam splitter.
Figure 6:
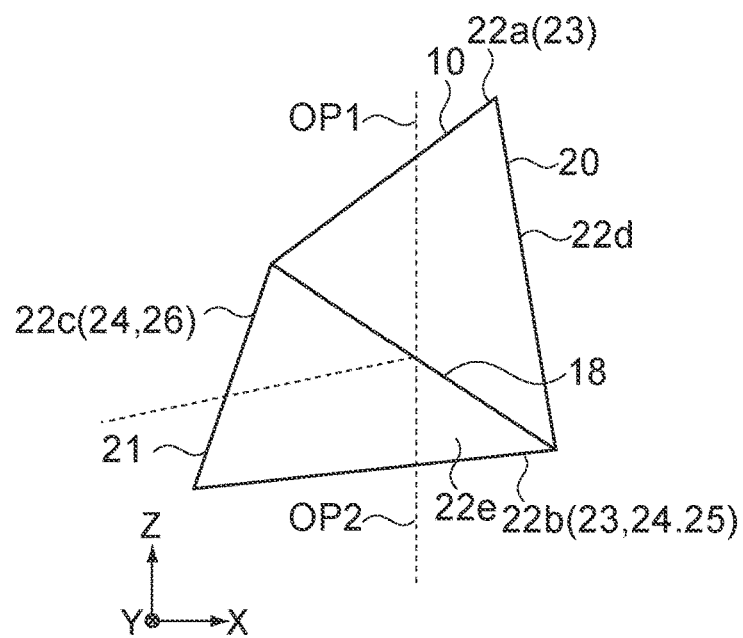
FIG. 6 is a schematic diagram showing a configuration example of the beam splitter.

FIGS. 4 to 6 are schematic diagrams each showing a configuration example of the beam splitter 10.

As illustrated in FIGS. 4 to 6, in this embodiment, a sandwich structure is employed as a configuration of the beam splitter 10. The sandwich structure is a structure in which the light-splitting surface 18 that splits light is sandwiched by two or more members.

A so-called cube-shaped beam splitter is included in the beam splitter 10 having the sandwich structure according to the present technology. The cube-shaped beam splitter can also be referred to as a beam splitter cube.

The beam splitter 10 shown in FIG. 4 has a cube shape and includes two 45-degree right-angle prisms 20 and 21 connected to each other. An inclined surface that is to be a connection surface of the two right-angle prisms 20 and 21 is configured as the light-splitting surface 18. For example, a dielectric multi-layer film is formed by vacuum vapor deposition or the like, so that the light-splitting surface 18 can be implemented. In addition, a specific configuration of the light-splitting surface 18 or a specific method of creating the light-splitting surface 18 is not limited.

If the beam splitter 10 shown in FIG. 4 is applied to the alignment microscope 4 shown in FIGS. 1 to 3, the light-splitting surface 18 splits each of the exposure light EL with which the mask mark MAM is irradiated, and the non-exposure light NEL with which the workpiece mark WAM is irradiated.

Further, the beam splitter 10 has an upper surface 22*a* and a lower surface 22*b* facing each other in the vertical direction (Z direction), a left surface 22*c* and a right surface 22*d* facing each other in the horizontal direction (X direction), and a front surface 22*e* and a back surface (reference symbol omitted) facing each other in the depth direction (Y direction).

The upper surface 22*a* and the lower surface 22*b* are disposed to be perpendicular to the vertical direction (Z direction) (intersection angle of 90 degrees). The left surface 22*c* and the right surface 22*d* are disposed to be perpendicular to the horizontal direction (X direction) (intersection angle of 90 degrees). The front surface 22*e* and the back surface are disposed to be perpendicular to the depth direction (Y direction) (intersection angle of 90 degrees).

The upper surface 22*a* of the beam splitter 10 is an incident surface 23 on which the exposure light EL radiated onto the mask mark MAM is incident from above. The lower surface 22*b* of the beam splitter 10 is an emission surface 24 from which the exposure light EL passing through the light-splitting surface 18 and traveling toward the lower side is emitted. The lower surface 22*b* of the beam splitter 10 is also an incident surface 23 on which the exposure light EL reflected toward the upper side from the reflective mirror 8 is incident. The left surface 22*c* of the beam splitter 10 is an emission surface 24 from which the exposure light EL reflected toward the left side by the light-splitting surface 18 is emitted.

Further, the lower surface 22*b* of the beam splitter 10 is an incident surface 25 on which the non-exposure light NEL radiated onto the workpiece mark WAM and reflected toward the upper side is incident. Further, the left surface 22*c* of the beam splitter 10 is an emission surface 26 from which the non-exposure light NEL reflected toward the left side by the light-splitting surface 18 is emitted.

As shown in FIG. 4, the beam splitter 10 is configured such that all of the upper surface 22*a*, the lower surface 22*b*, the left surface 22*c*, the right surface 22*d*, the front surface 22*e*, and the back surface have different surface directions with respect to the light-splitting surface 18.

In other words, the beam splitter 10 is configured such that all of the incident surface 23 on which the exposure light EL is incident, the emission surface 24 from which the exposure light EL is emitted, the incident surface 25 on which the non-exposure light NEL is incident, and the emission surface 26 from which the non-exposure light NEL is emitted have different surface directions with respect to the light-splitting surface 18.

As a feature of the beam splitter 10 according to the present technology, in addition to the point including the two members connected to each other so as to sandwich the light-splitting surface 18 therebetween (sandwich structure), the following point can be provided: all of the incident surface 23 on which the exposure light EL is incident, the emission surface 24 from which the exposure light EL is emitted, the incident surface 25 on which the non-exposure light NEL is incident, and the emission surface 26 from which the non-exposure light NEL is emitted have different surface directions with respect to the light-splitting surface 18 (hereinafter, referred to as surface direction condition).

Note that if two surfaces are parallel to each other, the surface directions of the two surfaces are equal to each other. On the other hand, two surfaces that are not parallel to each other have different surface directions. Further, it is possible to define a surface-direction intersection angle for two surfaces having different surface directions.

For example, if two surfaces intersect with each other, the intersection angle of the two surfaces can be used as a surface-direction intersection angle. If two surfaces do not intersect with each other, an intersection angle of infinite planes including those surfaces (two infinite planes) can be used as a surface-direction intersection angle.

For example, centering on an intersection line of two surfaces (intersection line of two infinite planes), a surface-direction intersection angle can be calculated in the range from 0 degrees to 180 degrees in a predetermined rotation direction (a clockwise rotation or a counterclockwise rotation may be possible). Note that intersection angles of 0 degrees and 180 degrees correspond to a state in which the two surfaces are parallel to each other.

The surface direction condition described above can also be expressed using a surface-direction intersection angle. In other words, the beam splitter 10 is configured such that each of the incident surface 23 on which the exposure light EL is incident, the emission surface 24 from which the exposure light EL is emitted, the incident surface 25 on which the non-exposure light NEL is incident, and the emission surface 26 from which the non-exposure light NEL is emitted has a surface-direction intersection angle of N degrees or more with respect to the light-splitting surface 18. Such an expression is possible.

If a specific value is substituted for the value of N in "N degrees or more", the surface direction condition can further be limited. For example, a beam splitter 10 having N of 30 degrees, a beam splitter 10 having the value of N in the range from 30 degrees to 50 degrees, and the like are included in the beam splitter 10 having the sandwich structure according to the present technology. As a matter of course, the present invention is not limited to such numerical values. For example, when a surface-direction intersection angle in the range from 0 degrees and 180 degrees in a predetermined rotation direction is defined, the beam splitter 10 according to the present technology can be configured using any value excluding 0 degrees and 180 degrees.

In the example shown in FIG. 4, the beam splitter 10 is configured such that each of the incident surface 23 on which the exposure light EL is incident, the emission surface 24 from which the exposure light EL is emitted, the incident surface 25 on which the non-exposure light NEL is incident, and the emission surface 26 from which the non-exposure light NEL is emitted has a surface-direction intersection angle of 45 degrees with respect to the light-splitting surface 18. Therefore, the beam splitter 10 shown in FIG. 4 is a beam splitter having the sandwich structure and satisfying the surface direction condition.

A beam splitter 10 shown in FIG. 5 has a configuration without having a cube shape. As shown in FIG. 5, the upper surface 22a and the lower surface 22b are configured to be parallel to each other. Meanwhile, the upper surface 22a and the lower surface 22b are not disposed to be perpendicular to the vertical direction (Z direction), and side portions on the left side are shifted downward.

Further, the left surface 22c and the right surface 22d are configured to be parallel to each other. Meanwhile, the left surface 22c and the right surface 22d are not disposed to be perpendicular to the horizontal direction (X direction), and side portions on the lower side are shifted toward the left side. The beam splitter 10 having such a shape is also a beam splitter having the sandwich structure and satisfying the surface direction condition.

Further, in a beam splitter 10 shown in FIG. 6, surface directions of the upper surface 22a, the lower surface 22b, the left surface 22c, the right surface 22d, the front surface 22e, and the back surface are further changed. The upper surface 22a and the lower surface 22b are not parallel to each other and intersect with the vertical direction (Z direction) at angles different from each other. The left surface 22c and the right surface 22d are not parallel to each other and intersect with the horizontal direction (X direction) at angles different from each other.

Further, the light-splitting surface 18 also intersects with the vertical direction (Z direction) at an angle different from 45 degrees. Therefore, it is difficult to apply the beam splitter 10 shown in FIG. 6 to the alignment microscope 4 shown in FIGS. 1 to 3. On the other hand, it is reasonable that suitably arranging the one or more aberration correction lenses 11, the objective lens 12, and the imaging unit 13 in accordance with the angle of the light-splitting surface 18 shown in FIG. 6 makes it possible to use those components as the alignment microscope 4 according to the present technology.

The beam splitter 10 shown in FIG. 6 is also a beam splitter having the sandwich structure and satisfying the surface direction condition. Note that the beam splitters 10 shown in FIGS. 5 and 6 can also be regarded as kinds of a so-called cube beam splitter.

As a matter of course, the configuration of the beam splitter 10 according to the present technology is not limited to the configurations shown in FIGS. 4 to 6. For example, the front surface 22e and the back surface may intersect with the depth direction (Y direction) at intersection angles different from each other. Further, which surface of the beam splitter 10 is to be set for any of the incident surface 23 for the exposure light EL, the emission surface 24 for the exposure light EL, the incident surface 25 for the non-exposure light NEL, and the emission surface 26 for the non-exposure light NEL is not limited and may be discretionally set.

Typically, the two members that sandwich the light-splitting surface 18 therebetween are made of a material having an identical refractive index. The present invention is not limited to such a configuration.

In the examples shown in FIGS. 4 to 6, the right-angle prisms 20 and 21 correspond to one embodiment of a first member and a second member according to the present technology. Which one of the two members is to be used as the first member (second member) is not limited and may be discretionally set.

The incident surface 23 on which the exposure light EL is incident corresponds to one embodiment of a first incident surface on which the first light is incident. The emission surface 24 from which the exposure light EL is emitted corresponds to one embodiment of a first emission surface from which the first light is emitted. The incident surface 25 on which the non-exposure light NEL is incident corresponds to one embodiment of a second incident surface on which the second light is incident. The emission surface 26 from which the non-exposure light NEL is emitted corresponds to one embodiment of a second emission surface from which the second light is emitted.

[Aberrations of Images of Mask Mark MAM and Workpiece Mark WAM]

If the beam splitter 10 having the sandwich structure as shown in FIGS. 4 to 6 is used, the right-angle prisms 20 and 21 are disposed in the first optical path OP1 and the second optical path OP2. In other words, a thick member having a refractive index different from that of air is disposed in the first optical path OP1 and the second optical path OP2.

The exposure light EL with which the mask mark MAN is irradiated, and the non-exposure light NEL with which the workpiece mark WAM is irradiated travel inside the right-angle prisms 20 and 21, and thus aberrations often occur in the images of the mask mark MAM and the workpiece mark WAM that are formed on the imaging unit 13. Note that the aberrations in the present disclosure are deviations from images of a mask mark MAM and a workpiece mark WAM that are formed by an ideal image-forming system.

For example, since the optical path lengths of the exposure light EL and the non-exposure light NEL traveling inside the right-angle prisms 20 and 21 are increased as compared with the case of traveling in air, blurring of images due to the deviation of a focal position (focus position) may occur (hereinafter, referred to as focal-position deviation). In addition, monochromatic aberrations such as spherical aberration, coma aberration, astigmatism, image surface distortion, and distortion aberration (distortion), and chromatic aberrations such as axial chromatic aberration and chromatic aberration of magnification may occur.

When such aberrations occur, the image-forming performance of the image of the mask mark MAM and the image of the workpiece mark WAM deteriorates, and the imaging accuracy of the image of the mask mark MAM and the image of the workpiece mark WAM deteriorates.

[Intersection Angle of Incident Surface and Emission Surface With Respect To Optical Path]

If the beam splitter 10 having the sandwich structure as shown in FIGS. 4 to 6 is used, in order to suppress the aberrations of the images of the mask mark MAM and the workpiece mark WAM, it is desirable to arrange the incident surfaces 23 and 25 for the exposure light EL and the non-exposure light NEL to be perpendicular to the first optical path OP1 and the second optical path OP2.

For example, the incident surface 23 for the exposure light EL is disposed such that the intersection angle falls within the range from 75 degrees to 105 degrees with respect to the first optical path OP1. Further, the incident surface 25 for the non-exposure light NEL is disposed such that the intersection angle falls within the range from 75 degrees to 105 degrees with respect to the second optical path OP2. This makes it possible to suppress the aberrations of the images of the mask mark MAM and the workpiece mark WAM.

If the incident surface 23 for the exposure light EL is disposed at an intersection angle of 90 degrees with respect to the first optical path OP1, the effect of suppressing aberrations is further exerted. Similarly, if the incident surface 25 for the non-exposure light NEL is disposed at an intersection angle of 90 degrees with respect to the second optical path OP2, the effect of suppressing aberrations is further exerted.

Further, in order to suppress the aberrations of the images of the mask mark MAM and the workpiece mark WAM, it is desirable to arrange the emission surfaces 24 and 26 for the exposure light EL and the non-exposure light NEL to be perpendicular to the first optical path OP1 and the second optical path OP2.

For example, the emission surface 24 for the exposure light EL is disposed such that the intersection angle falls within the range from 75 degrees to 105 degrees with respect to the first optical path OP1. Further, the emission surface 26 for the non-exposure light NEL is disposed such that the intersection angle falls within the range from 75 degrees to 105 degrees with respect to the second optical path OP2. This makes it possible to suppress the aberrations of the images of the mask mark MAM and the workpiece mark WAM.

If the emission surface 24 for the exposure light EL is disposed at an intersection angle of 90 degrees with respect to the first optical path OP1, the effect of suppressing aberrations is further exerted. Similarly, if the emission surface 26 for the non-exposure light NEL is disposed at an intersection angle of 90 degrees with respect to the second optical path OP2, the effect of suppressing aberrations is further exerted.

[Arrangement of Aberration Correction Lenses]

In the alignment microscope 4 according to this embodiment, one or more aberration correction lenses 11 are disposed in order to correct (cancel) aberrations.

As the one or more aberration correction lenses 11, one or more first aberration correction lenses 28 are disposed in the first optical path OP1 so as to correct the aberration of the image of the mask mark MAM. Further, as the one or more aberration correction lenses 11, one or more second aberration correction lenses 29 are disposed in the second optical path OP2 so as to correct the aberration of the workpiece mark WAM.

FIGS. 7 to 11 are schematic diagrams showing arrangement examples of the one or more aberration correction lenses 11.

In the examples shown in FIGS. 7 to 11, a CCD camera is used as the imaging unit 13. Further, the objective lens 12 is schematically illustrated using two lenses. If an image-forming system including an image-forming lens such as a non-telecentric lens is used as the imaging unit 13, the image-forming system is disposed between the CCD camera and the objective lens 12.

Using an example in which the beam splitter 10 shown in FIG. 4 is used in the alignment microscope 4 shown in FIGS. 1 to 3, an arrangement example of the one or more first aberration correction lenses 28 and the one or more second aberration correction lenses 29 will be described.

Figure 7:
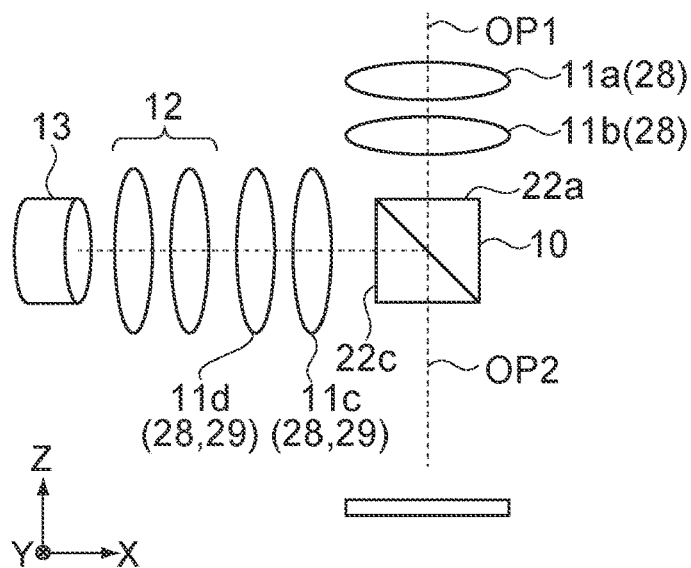
FIG. 7 is a schematic diagram showing an arrangement example of aberration correction lenses.

In the example shown in FIG. 7, two aberration correction lenses 11a and 11b are disposed at a position facing the upper surface 22a of the beam splitter 10. Further, two aberration correction lenses 11c and 11d are disposed at a position facing the left surface 22c of the beam splitter 10.

The two aberration correction lenses 11a and 11b and the two aberration correction lenses 11c and 11d are disposed in the first optical path OP1 of the exposure light EL. Therefore, the two aberration correction lenses 11a and 11b and the two aberration correction lenses 11c and 11d function as the first aberration correction lenses 28 for correcting the aberration of the image of the mask mark MAM.

Further, the two aberration correction lenses 11c and 11d are also disposed in the second optical path OP2 of the non-exposure light NEL. Therefore, the two aberration correction lenses 11c and 11d also function as the second aberration correction lenses 29 for correcting the aberration of the image of the workpiece mark WAM. In other words, the two aberration correction lenses 11c and 11d serve as both the first aberration correction lenses 28 and the second aberration correction lenses 29.

In the example shown in FIG. 7, the first aberration correction lenses 28 are disposed at a position facing the incident surface 23 (upper surface 22a) for the exposure light EL and at a position facing the emission surface 24 (left surface 22c) for the exposure light EL. Further, the second aberration correction lenses 29 are disposed at a position facing the emission surface 26 (left surface 22c) for the non-exposure light NEL.

In the example shown in FIG. 7, the left surface 22c of the beam splitter 10 is a surface from which both the exposure light EL and the non-exposure light NEL are emitted (hereinafter, referred to as common emission surface). Therefore, the example shown in FIG. 7 can also be referred to as a configuration in which the first aberration correction lenses 28 and the second aberration correction lenses 29 are disposed at a position facing the common emission surface (left surface 22c).

Further, as described above, the second optical path OP2 is a common optical path in which both the exposure light EL and the non-exposure light NEL travel. The example shown in FIG. 7 can also be referred to as a configuration in which aberration correction lenses functioning as the first aberration correction lens 28 and also as the second aberration correction lens 29 (hereinafter, referred to as common correction lenses) are disposed in the common optical path.

Furthermore, the example shown in FIG. 7 can also be referred to as a configuration in which the two common correction lenses (aberration correction lenses 11c and 11d) are disposed at a position facing the common emission surface (left surface 22c) from which both the exposure light EL and the non-exposure light NEL are emitted, the exposure light EL and the non-exposure light NEL traveling in the common optical path from the beam splitter 10 toward the imaging unit 13.

Arranging the common correction lenses as the one or more aberration correction lenses 11 makes it possible to reduce the number of aberration correction lenses 11 and achieve a reduction in size of the apparatus, a simplified design, suppression of component costs, and the like.

Note that the present invention is not limited to the case where the aberration correction lenses 11 disposed in the common optical path are necessarily designed as the common correction lenses. For example, the lenses may be designed so as to be disposed in the common optical path but exert only the function of the first aberration correction lens 28. In this case, it is desirable to design the lenses in which the influence on the non-exposure light NEL is suppressed. Further, the lenses may be designed so as to be disposed in the common optical path but exert only the function of the second aberration correction lens 29. In this case, it is desirable to design the lenses in which the influence on the exposure light EL is suppressed.

Figure 8:
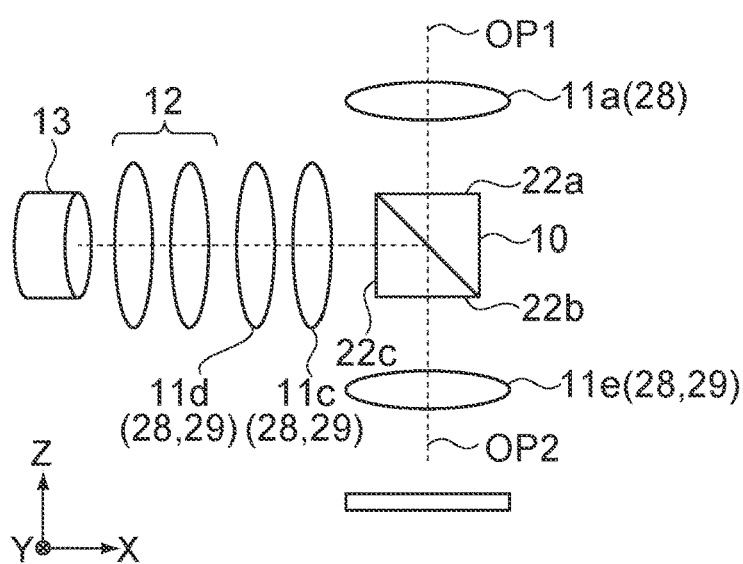
FIG. 8 is a schematic diagram showing an arrangement example of the aberration correction lenses.

In the example shown in FIG. 8, a single aberration correction lens 11a is disposed at a position facing the upper surface 22a of the beam splitter 10. Further, a single aberration correction lens 11e is disposed at a position facing the lower surface 22b of the beam splitter 10. Further, two aberration correction lenses 11c and 11d are disposed at a position facing the left surface 22c of the beam splitter 10.

The single aberration correction lens 11a, the single aberration correction lens 11e, and the two aberration correction lenses 11c and 11d are disposed in the first optical path OP1 of the exposure light EL. Therefore, the single aberration correction lens 11a, the single aberration correction lens 11e, and the two aberration correction lenses 11c and 11d function as the first aberration correction lenses 28 for correcting the aberration of the image of the mask mark MAM.

The single aberration correction lens 11e and the two aberration correction lenses 11c and 11d are disposed in the second optical path OP2 of the non-exposure light NEL. Therefore, the single aberration correction lens 11e and the two aberration correction lenses 11c and 11d function as the second aberration correction lenses 29 for correcting the aberration of the image of the workpiece mark WAM. Therefore, the single aberration correction lens 11e and the two aberration correction lenses 11c and 11d serve as both the first aberration correction lenses 28 and the second aberration correction lenses 29.

In the example shown in FIG. 8, the first aberration correction lenses 28 are disposed at a position facing the incident surface 23 (upper surface 22a, lower surface 22b) for the exposure light EL and at a position facing the emission surface 24 (lower surface 22b, left surface 22c) for the exposure light EL. Further, the second aberration correction lenses 29 are disposed at a position facing the incident surface 25 (lower surface 22b) for the non-exposure light NEL and at a position facing the emission surface 26 (left surface 22c) for the non-exposure light NEL.

Further, in FIG. 8, the lower surface 22b of the beam splitter 10 is a surface on which both the exposure light EL and the non-exposure light NEL are incident (hereinafter, referred to as common incident surface). Therefore, the example shown in FIG. 8 can also be referred to as a configuration in which the first aberration correction lenses 28 and the second aberration correction lenses 29 are disposed at a position facing the common incident surface (lower surface 22b) and at a position facing the common emission surface (left surface 22c).

Further, the example of FIG. 8 can also be referred to as a configuration in which the common correction lenses (aberration correction lenses 11c to 11e) functioning as the first aberration correction lenses 28 and also as the second aberration correction lenses 29 are disposed in the common optical path.

Furthermore, the example shown in FIG. 8 can also be referred to as a configuration in which the two common correction lenses (aberration correction lenses 11c and 11d) are disposed at a position facing the common emission surface (left surface 22c) from which both the exposure light EL and the non-exposure light NEL are emitted, the exposure light EL and the non-exposure light NEL traveling in the common optical path from the beam splitter 10 toward the imaging unit 13.

Figure 9:
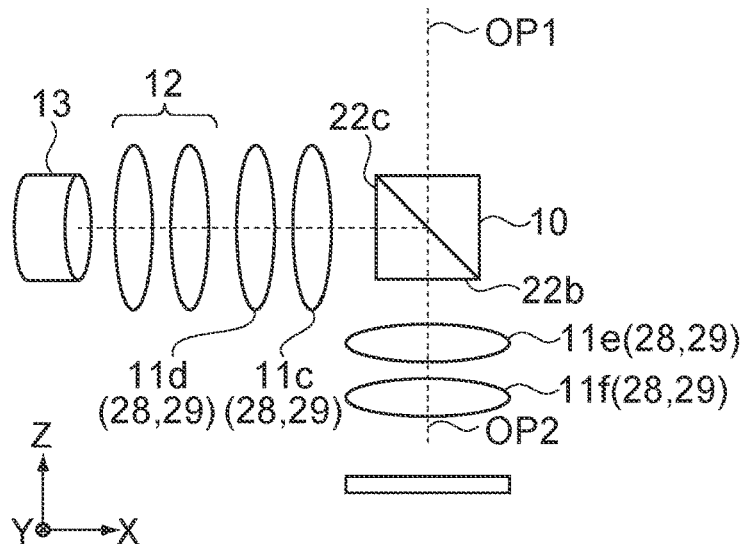
FIG. 9 is a schematic diagram showing an arrangement example of the aberration correction lenses.

In the example shown in FIG. 9, two aberration correction lenses 11e and 11f are disposed at a position facing the lower surface 22b of the beam splitter 10. Further, two aberration correction lenses 11c and 11d are disposed at a position facing the left surface 22c of the beam splitter 10.

The two aberration correction lenses 11e and 11f and the two aberration correction lenses 11c and 11d are disposed in the first optical path OP1 of the exposure light EL and the second optical path OP2 of the non-exposure light NEL. Therefore, the two aberration correction lenses 11e and 11f and the two aberration correction lenses 11c and 11d are common correction lenses functioning as the first aberration correction lenses 28 and as the second aberration correction lens 29. In other words, the example shown in FIG. 9 is a configuration in which the one or more aberration correction lenses 11 include four common correction lenses.

Further, the example shown in FIG. 9 can also be referred to as a configuration in which the common correction lenses (aberration correction lenses 11c to 11f) are disposed at positions facing the common incident surface (lower surface 22b) and the common emission surface (left surface 22c).

Further, the example shown in FIG. 9 can also be referred to as a configuration in which the two common correction lenses (aberration correction lenses 11c and 11d) are disposed at a position facing the common emission surface (left surface 22c) from which both the exposure light EL and the non-exposure light NEL are emitted, the exposure light EL and the non-exposure light NEL traveling in the common optical path from the beam splitter 10 toward the imaging unit 13.

The one or more aberration correction lenses 11 are all configured as the common correction lenses, which is more advantageous in a reduction in size of the apparatus, a simplified design, suppression of component costs, and the like.

Figure 10:
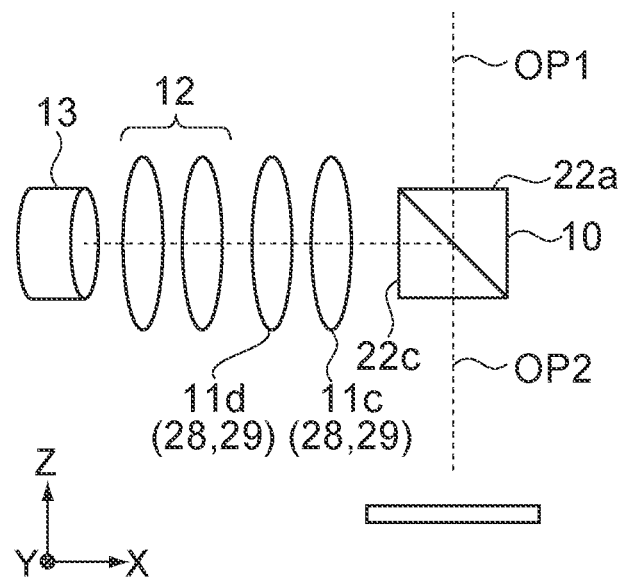
FIG. 10 is a schematic diagram showing an arrangement example of the aberration correction lenses.

In the example shown in FIG. 10, two aberration correction lenses 11c and 11d are disposed at a position facing the left surface 22c of the beam splitter 10.

The two aberration correction lenses 11c and 11d are disposed in the first optical path OP1 of the exposure light EL and the second optical path OP2 of the non-exposure light NEL. Therefore, the two aberration correction lenses 11c and 11d are common correction lenses functioning as the first aberration correction lenses 28 and as the second aberration correction lenses 29. In other words, the example shown in FIG. 10 is a configuration in which the one or more aberration correction lenses 11 include two common correction lenses.

Further, the example shown in FIG. 10 can also be referred to as a configuration in which the common correction lenses (aberration correction lenses 11c and 11d) are disposed at a position facing the common emission surface (left surface 22c).

Further, the example shown in FIG. 10 can also be referred to as a configuration in which the two common correction lenses (aberration correction lenses 11c and 11d) are disposed at a position facing the common emission surface (left surface 22c) from which both the exposure light EL and the non-exposure light NEL are emitted, the exposure light EL and the non-exposure light NEL traveling in the common optical path from the beam splitter 10 toward the imaging unit 13.

Figure 11:
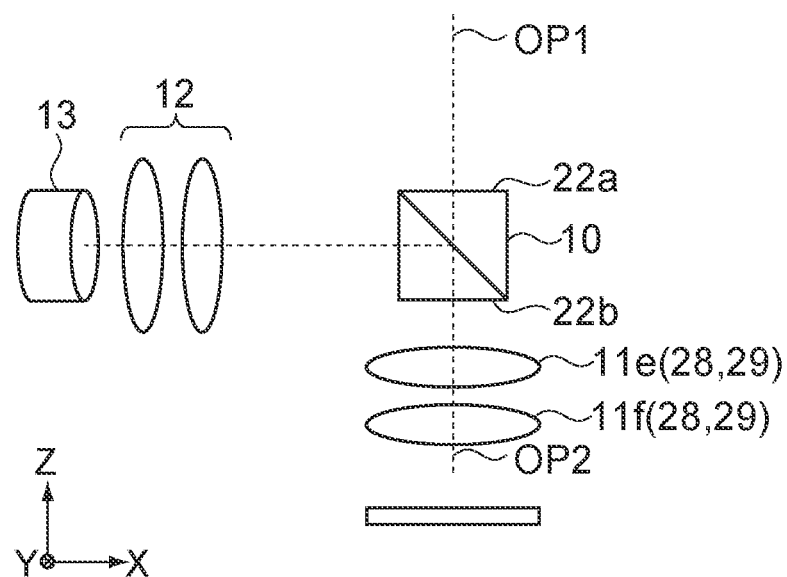
FIG. 11 is a schematic diagram showing an arrangement example of the aberration correction lenses.

In the example shown in FIG. 11, two aberration correction lenses 11e and 11f are disposed at a position facing the lower surface 22b of the beam splitter 10.

The two aberration correction lenses 11e and 11f are disposed in the first optical path OP1 of the exposure light EL and the second optical path OP2 of the non-exposure light NEL. Therefore, the two aberration correction lenses 11e and 11f are common correction lenses functioning as the first aberration correction lenses 28 and as the second aberration correction lenses 29. In other words, the example shown in FIG. 11 is a configuration in which the one or more aberration correction lenses 11 include two common correction lenses.

Further, the example shown in FIG. 11 can also be referred to as a configuration in which the common correction lenses (aberration correction lenses 11e and 11f) are disposed at a position facing the incident surface (lower surface 22b).

A specific lens design or the like of the aberration correction lenses 11 (first aberration correction lens 28, second aberration correction lens 29) is not limited, and the lenses may be discretionally designed in accordance with the type of an aberration to be corrected. For example, if a focal position deviation is to be corrected, an aberration correction lens having positive power is disposed. This makes it possible to restore the focus position to the near side by the amount shifted to a distant position due to an increase in the optical path length and to correct the focal position deviation.

The present invention is not limited to the lens design as described above, and any optical lens such as a double-convex lens, a double-concave lens, a plano-convex lens, a plano-concave lens, a convex meniscus lens, or a concave meniscus lens may be used as the aberration correction lens 11. Further, the shape of the lens surface is not limited, and a spherical shape or an aspherical shape may be discretionally designed.

For example, increasing the number of aberration correction lenses 11 disposed in the first optical path OP1 and the second optical path OP2 makes it possible to improve correction accuracy of a predetermined aberration and correct various types of aberrations together, for example. Further, it is also possible to restore fluctuations of the magnification by arranging two or more aberration correction lenses 11. In other words, it is also possible to correct the magnification in addition to the correction of the aberration. Note that the fluctuations of the magnification are also assumed to be included in the aberration (hereinafter, referred to as magnification aberration).

Meanwhile, decreasing the number of aberration correction lenses 11 makes it possible to achieve a reduction in size of the apparatus, a simplified design, suppression of component costs, and the like. For example, narrowing down aberrations to be corrected makes it possible to suppress the number of aberration correction lenses 11.

For example, it is also possible to set priority for aberrations to be corrected and to narrow down aberrations having high priority as correction targets. For example, highest priority is set for correction of the focal position deviation. Priority at one rank below is then set for correction of a chromatic aberration, and priority at further one rank below is set for correction of a magnification aberration. Other aberrations are excluded from the correction targets.

The lens design, the number, the arrangement position, and the like of the one or more aberration correction lenses 11 are appropriately set for the setting of the priority. For example, the configuration of the aberration correction lens is set with only an aberration having the highest priority as being used a correction target. Alternatively, various types of aberrations are selected as correction targets in descending order of priority, and the configuration of the aberration correction lens 11 is set. Various designs as described above are possible.

As shown in FIGS. 7 to 11, the position at which the aberration correction lens 11 is disposed can be set in various ways, such as the position between the projection lens 3 and the beam splitter 10, the position between the beam splitter 10 and the workpiece stage WS (workpiece W), and the position between the beam splitter 10 and the imaging unit 13.

The exposure light EL and the non-exposure light NEL are light different from each other in wavelength. Therefore, the one or more first aberration correction lenses 28 corresponding to the wavelength of the exposure light EL are disposed in the first optical path OP1. Further, the one or more second aberration correction lenses 29 corresponding to the wavelength of the non-exposure light NEL are disposed in the second optical path OP2. This makes it possible to improve the correction accuracy of the aberration.

Meanwhile, as illustrated in FIGS. 7 to 11, use of the common correction lenses functioning as the first aberration correction lenses 28 and also as the second aberration correction lenses 29 also makes it possible to sufficiently correct aberrations of both the exposure light EL and the non-exposure light NEL.

The configuration of the aberration correction lens 11 can also be set by paying attention to the number of times the exposure light EL radiated onto the mask mark MAM and the non-exposure light NEL radiated onto the workpiece mark WAM pass through the inside of the beam splitter 10. For example, when the light passes through the inside of the beam splitter 10 N times, the one or more aberration correction lenses 11 are configured so as to be capable of correcting aberrations corresponding to the N times. This makes it possible to improve the correction accuracy of the aberrations.

For example, a set of one or more aberration correction lenses 11 is configured so as to be capable of correcting an aberration corresponding to one time, which is generated when the light passes through the inside the beam splitter 10 once. If the exposure light EL passes through the beam splitter 10 N times, the same N sets are disposed in the first optical path OP1 of the exposure light EL. Similarly, for the non-exposure light NEL, the number of sets that is the same as the number of times the light passes through the beam splitter 10 are disposed in the second optical path OP2 of the non-exposure light NEL. This makes it possible to improve the correction accuracy of the aberrations.

For example, in the example shown in FIG. 11, the two aberration correction lenses 11e and 11d are configured as a set capable of correcting an aberration corresponding to one time. The exposure light EL passes through the inside of the beam splitter 10 twice and passes through the two aberration correction lenses 11e and 11d twice. Further, the non-exposure light NEL passes through the inside of the beam splitter 10 once and passes through the two aberration correction lenses 11e and 11d once. As a result, the aberrations corresponding to two times are corrected for the exposure light EL with high accuracy. Further, the aberration corresponding to one time is corrected for the non-exposure light NEL with high accuracy.

The objective lens 12 may be provided with the function of the aberration correction lens 11 (the function of the first aberration correction lens 28 or the function of the second aberration correction lens 29). This is advantageous in a reduction in size of the apparatus. In this case, the objective lens 12 is one embodiment of an aberration correction lens (first aberration correction lens or second aberration correction lens) according to the present invention.

In the examples shown in FIGS. 1 to 3, the alignment microscope 4 and the position detector 16 of the controller 6 are constituent elements that function as one embodiment of a detection apparatus according to the present invention. In other words, the exposure apparatus 1 can also be referred to as an exposure apparatus equipped with the detection apparatus according to the present invention.

The detection apparatus according to the present invention may be incorporated into the exposure apparatus 1 so as to be integrally formed. Alternatively, separately from the exposure apparatus 1, the detection apparatus including the alignment microscope 4 and the position detector 16 may be configured independently. The detection apparatus may be appropriately incorporated into the exposure apparatus 1. Alternatively, only the alignment microscope 4 may be interchangeably integrated into the exposure apparatus 1.

As described above, in the exposure apparatus 1 (detection apparatus) according to this embodiment, the sandwich structure in which the light-splitting surface 18 for splitting each of the exposure light EL and the non-exposure light NEL is sandwiched between the right-angle prism 20 and the right-angle prism 21 is employed as the configuration of the beam splitter 10 included in the alignment microscope 4. This makes it possible to stably exert the function of splitting light corresponding to each of the exposure light EL and the non-exposure light NEL by the light-splitting surface 18.

For example, it is assumed that a pellicle-type beam splitter is used as the beam splitter. Since the pellicle-type beam splitter has a thin film-like configuration, vibration is easily generated when cooling air is blown, for example. As a result, the accuracy of the image of the mask mark MAM and the image of the workpiece mark WAM deteriorates, and it becomes difficult to exert high-level accuracy in alignment.

In this embodiment, the beam splitter 10 having the sandwich structure as illustrated in FIG. 4 or the like is used. This makes it possible to sufficiently prevent the light-splitting surface 18 from vibrating, and to stably exert the light-splitting function.

Further, in the exposure apparatus 1 (detection apparatus) according to this embodiment, the aberration correction lenses 11 are disposed in the first optical path OP1 and the second optical path OP2. This makes it possible to capture the image of the mask mark MAM and the image of the workpiece mark WAM with high accuracy and to detect the position of the mask mark and the position of the workpiece mark with high accuracy. As a result, it is possible to perform alignment of the exposure mask M and the workpiece W with high accuracy.

As described above, in the exposure apparatus 1 (detection apparatus) according to this embodiment, since the aberration can be sufficiently suppressed without being affected by the vibration of the light-splitting surface 18, it is possible to improve the image-forming performance in the imaging unit 13 and to perform alignment with high accuracy. Further, it is possible to display a high-quality image of an alignment mark on the monitor 5 and to perform confirmation by an operator or the like with high accuracy.

Other Embodiments

The present invention is not limited to the embodiment described above and can implement various other embodiments.

Use of the exposure apparatus according to the present invention to perform exposure makes it possible to manufacture various substrates, on which predetermined patterns are formed, as components. For example, an electric circuit element, an optical element, a micro electro mechanical systems (MEMS), a recording element, a sensor, a mold, or the like can be manufactured as a component.

Examples of the electric circuit element include volatile or non-volatile semiconductor memories such as a dynamic random access memory (DRAM), a static random access memory (SRAM), a flash memory, and an magnetoresistive random access memory (MRAM), and semiconductor elements such as an large scale integration (LSI), a charge-coupled device (CCD), an image sensor, and a field-programmable gate array (FPGA). Examples of the mold include a mold for imprinting.

An apparatus to which the detection apparatus and the alignment microscope according to the present invention are applicable is not limited to the exposure apparatus. The detection apparatus and the alignment microscope according to the present invention are also applicable to detection of alignment marks in an optical processing apparatus such as a laser processing apparatus. In addition, the detection apparatus and the alignment microscope according to the present invention can be applied to any light irradiation apparatus in which alignment marks are used to perform mutual alignment.

In the description above, the case where the alignment microscope 4 including the beam splitter 10, the one or more aberration correction lenses 11, the objective lens 12, and the imaging unit 13 is configured as a single unit has been described as an example. The present invention is not limited to the above, and any constituent element of the beam splitter 10, the one or more aberration correction lenses 11, the objective lens 12, and the imaging unit 13 may be fixed to the exposure apparatus 1 side, provided that it does not interfere with a normal exposure step. For example, the imaging unit 13 and the objective lens 12 may be fixed, and a unit including the beam splitter 10 and the one or more aberration correction lenses 11 may be configured to be movable. In addition, various configurations may be employed.

The configurations of the exposure apparatus, the detection apparatus, the alignment microscope, the beam splitter, the aberration correction lens, the controller, and the like described above with reference to the respective figures are merely embodiments and can be discretionarily modified without departing from the gist of the present technology. In other words, any other configurations for the purpose of practicing the present technology may be employed.

In the present disclosure, to easily understand the description, the words such as "substantially", "approximately", and "about" are appropriately used. Meanwhile, it does not define a clear difference between the case where those words such as "substantially", "approximately", and "about" are used and the case where those words are not used.

In other words, in the present disclosure, concepts defining shapes, sizes, positional relationships, states, and the like, such as "central", "middle", "uniform", "equal", "same", "orthogonal", "parallel", "symmetric", "extended", "axial", "columnar", "cylindrical", "ring-shaped", and "annular", are concepts including "substantially central", "substantially middle", "substantially uniform", "substantially equal", "substantially the same", "substantially orthogonal", "substantially parallel", "substantially symmetric", "substantially extended", "substantially axial", "substantially columnar", "substantially cylindrical", "substantially ring-shaped", "substantially annular", and the like.

For example, the states included in a predetermined range (e.g., range of ±10%) with reference to "completely central", "completely middle", "completely uniform", "completely equal", "completely the same", "completely orthogonal", "completely parallel", "completely symmetric", "completely extended", "completely axial", "completely columnar", "completely cylindrical", "completely ring-shaped", "completely annular", and the like are also included.

Therefore, even if the words such as "substantially", "approximately", and "about" are not added, the concept that may be expressed by adding so-called "substantially", "approximately", and "about" thereto can be included. To the contrary, the complete states are not necessarily excluded from the states expressed by adding "substantially", "approximately", "about", and the like.

In the present disclosure, expressions using the term "than" such as "larger than A" and "smaller than A" are expressions that comprehensively include concepts that include the case of being equal to A and concepts that do not include the case of being equal to A. For example, "larger than A" is not limited to the case where it does not include "equal to A"; however, it also includes "equal to or larger than A". Further, "smaller than A" is not limited to "less than A"; it also includes "equal to or smaller than A".

Upon implementation of the present technology, specific settings and other settings may be appropriately employed from the concepts that are included in "larger than A" and "smaller than A" to achieve the effects described above.

At least two of the features among the features described above according to the present technology can also be combined. In other words, various features described in the respective embodiments may be combined discretionarily regardless of the embodiments. Further, the various effects described above are merely illustrative and not restrictive, and other effects may be exerted.

It should be understood by those skilled in the art that various modifications, combinations, sub-combinations and alterations may occur depending on design requirements and other factors insofar as they are within the scope of the appended claims or the equivalents thereof.

What is claimed is:

1. A detection apparatus, comprising:
an alignment microscope that is disposed in an optical path of first light with which a mask mark as an alignment mark of an exposure mask is irradiated, and in an optical path of second light with which a workpiece mark as an alignment mark of a workpiece is irradiated, and captures an image of the mask mark and an image of the workpiece mark; and
a position detector that detects a position of the mask mark and a position of the workpiece mark on a basis of the image of the mask mark and the image of the workpiece mark, the images being captured by the alignment microscope, wherein
the alignment microscope includes
an imaging unit,
a beam splitter that splits each of the first light and the second light and emits the split first light and the split second light to the imaging unit, and one or more aberration correction lenses,
the beam splitter includes
a light-splitting surface that splits each of the first light and the second light, and
a first member and a second member that are connected to each other with the light-splitting surface being sandwiched therebetween,
all of a first incident surface on which the first light is incident, a first emission surface from which the first light is emitted, a second incident surface on which the second light is incident, and a second emission surface from which the second light is emitted are configured to have different surface directions with respect to the light-splitting surface, and
the one or more aberration correction lenses include
one or more first aberration correction lenses that are disposed in a first optical path, the first optical path being the optical path of the first light to the imaging unit, and one or more second aberration correction lenses that are disposed in a second optical path, the second optical path being the optical path of the second light to the imaging unit.

2. The detection apparatus according to claim 1, wherein the beam splitter is a cube beam splitter.

3. The detection apparatus according to claim 1, wherein the beam splitter is configured such that each of the first incident surface, the first emission surface, the second incident surface, and the second emission surface has a surface-direction intersection angle that is larger than 30 degrees with respect to the light-splitting surface.

4. The detection apparatus according to claim 1, wherein the beam splitter is configured such that each of the first incident surface, the first emission surface, the second incident surface, and the second emission surface has a surface-direction intersection angle that is 45 degrees with respect to the light-splitting surface.

5. The detection apparatus according to claim 1, wherein the beam splitter is configured such that the first incident surface has an intersection angle falling within a range from 75 degrees to 105 degrees with respect to the first optical path.

6. The detection apparatus according to claim 1, wherein the beam splitter is configured such that the first emission surface has an intersection angle falling within a range from 75 degrees to 105 degrees with respect to the first optical path.

7. The detection apparatus according to claim 1, wherein the beam splitter is configured such that the second incident surface has an intersection angle falling within a range from 75 degrees to 105 degrees with respect to the second optical path.

8. The detection apparatus according to claim 1, wherein the beam splitter is configured such that the second emission surface has an intersection angle falling within a range from 75 degrees to 105 degrees with respect to the second optical path.

9. The detection apparatus according to claim 1, wherein the one or more first aberration correction lenses are disposed in at least one of a position facing the first incident surface or a position facing the first emission surface, and
the one or more second aberration correction lenses are disposed in at least one of a position facing the second incident surface or a position facing the second emission surface.

10. The detection apparatus according to claim 1, wherein the one or more first aberration correction lenses are disposed in at least one of a position facing a common incident surface on which both the first light and the second light are incident or a position facing a common emission surface from which both the first light and the second light are emitted, and
the one or more second aberration correction lenses are disposed in at least one of the position facing the common incident surface or the position facing the common emission surface.

11. The detection apparatus according to claim 1, wherein the first optical path and the second optical path include a common optical path, and
the one or more aberration correction lenses include one or more common correction lenses that are disposed in the common optical path and function as the first aberration correction lenses and as the second aberration correction lenses.

12. The detection apparatus according to claim 11, wherein
the one or more aberration correction lenses are configured as the one or more common correction lenses.

13. The detection apparatus according to claim 11, wherein
the common optical path includes the optical path of the first light and the optical path of the second light, the first light and the second light being emitted from the beam splitter to the imaging unit, and
the one or more common correction lenses are disposed in a position facing a common emission surface from which both the first light and the second light are emitted, the first light and the second light traveling in the common optical path from the beam splitter to the imaging unit.

14. The detection apparatus according to claim 1, wherein the first member and the second member are made of a material having an identical refractive index.

15. The detection apparatus according to claim 1, wherein the first light is exposure light, and
the second light is non-exposure light.

16. An exposure apparatus, comprising:
the detection apparatus according to claim 1,
a light-emission unit that emits the exposure light;
a mask stage that holds the exposure mask; and
a workpiece stage that holds the workpiece, wherein
at least one of the mask stage or the workpiece stage is configured to be movable.

17. An alignment microscope, comprising:
an imaging unit;
a beam splitter that splits each of first light with which a mask mark as an alignment mark of an exposure mask is irradiated, and second light with which a workpiece mark as an alignment mark of a workpiece is irradiated, and emits the split first light and the split second light to the imaging unit; and
one or more aberration correction lenses, wherein
the beam splitter includes
a light-splitting surface that splits each of the first light and the second light, and
a first member and a second member that are connected to each other with the light-splitting surface being sandwiched therebetween,
all of a first incident surface on which the first light is incident, a first emission surface from which the first light is emitted, a second incident surface on which the second light is incident, and a second emission surface from which the second light is emitted are configured to have different surface directions with respect to the light-splitting surface, and
the one or more aberration correction lenses include
one or more first aberration correction lenses that are disposed in a first optical path, the first optical path being an optical path of the first light to the imaging unit, and
one or more second aberration correction lenses that are disposed in a second optical path, the second optical path being an optical path of the second light to the imaging unit.

* * * * *